US012310070B2

(12) United States Patent
Chou et al.

(10) Patent No.: US 12,310,070 B2

(45) **Date of Patent: *May 20, 2025**

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Pei-Yu Chou, Hsinchu County (TW); Tze-Liang Lee, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/404,855

(22) Filed: Jan. 4, 2024

(65) Prior Publication Data

US 2024/0145535 A1 May 2, 2024

Related U.S. Application Data

(63) Continuation of application No. 17/383,828, filed on Jul. 23, 2021, now Pat. No. 11,901,409.

(51) Int. Cl.

| | |
|---|---|
| ***H01L 29/94*** | (2006.01) |
| ***H01L 29/76*** | (2006.01) |
| ***H10D 30/01*** | (2025.01) |
| ***H10D 30/62*** | (2025.01) |
| ***H10D 62/10*** | (2025.01) |
| ***H10D 62/13*** | (2025.01) |
| ***H10D 84/01*** | (2025.01) |
| ***H10D 84/03*** | (2025.01) |

(52) U.S. Cl.

CPC ......... *H10D 62/115* (2025.01); *H10D 30/024* (2025.01); *H10D 30/6211* (2025.01); *H10D 62/149* (2025.01); *H10D 84/0151* (2025.01); *H10D 84/038* (2025.01)

(58) Field of Classification Search

CPC ......... H01L 29/0649; H01L 21/823481; H01L 29/0843; H01L 29/66795; H01L 29/7851; H01L 21/823431; H01L 27/0886; H01L 27/088; H01L 21/823475

USPC .......................................................... 257/288

See application file for complete search history.

(56) References Cited

U.S. PATENT DOCUMENTS

| | | | | |
|---|---|---|---|---|
| 11,901,409 | B2 * | 2/2024 | Chou | H01L 29/66795 |
| 2011/0171823 | A1 * | 7/2011 | Hussein | H01L 23/5222 438/622 |
| 2012/0319279 | A1 * | 12/2012 | Isobayashi | H01L 23/53238 438/653 |
| 2017/0294337 | A1 * | 10/2017 | Kim | H01L 23/53266 |
| 2021/0098365 | A1 | 4/2021 | Chou et al. | |

* cited by examiner

*Primary Examiner* — Theresa T Doan

(74) *Attorney, Agent, or Firm* — WPAT LAW; Anthony King

(57) ABSTRACT

A semiconductor device and method of manufacturing the same are provided. The semiconductor device includes a substrate, an interlayer dielectric (ILD), and a conductive layer. The ILD is disposed on the substrate. The conductive layer is disposed on the substrate and spaced apart from the ILD by an air gap. The ILD is tapered toward the substrate.

20 Claims, 19 Drawing Sheets

100 A 160 160-1 160-2 150 156 154 152 168 166 162 164 138 136 140 132 114 112 128 110 134 122 120 124 Y X

SEMICONDUCTOR DEVICE AND METHOD OF MANUFACTURING THE SAME

CROSS-REFERENCE TO RELATED APPLICATIONS

This application is a continuation of U.S. application Ser. No. 17/383,828, filed on Jul. 23, 2021. The above-referenced application is hereby incorporated herein by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process)) has decreased. This scaling down process generally provides benefits by increasing production efficiency and lowering associated costs.

Such scaling down has also increased the complexity of manufacturing ICs, and for these advances to be realized, corresponding developments in IC manufacturing are needed.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
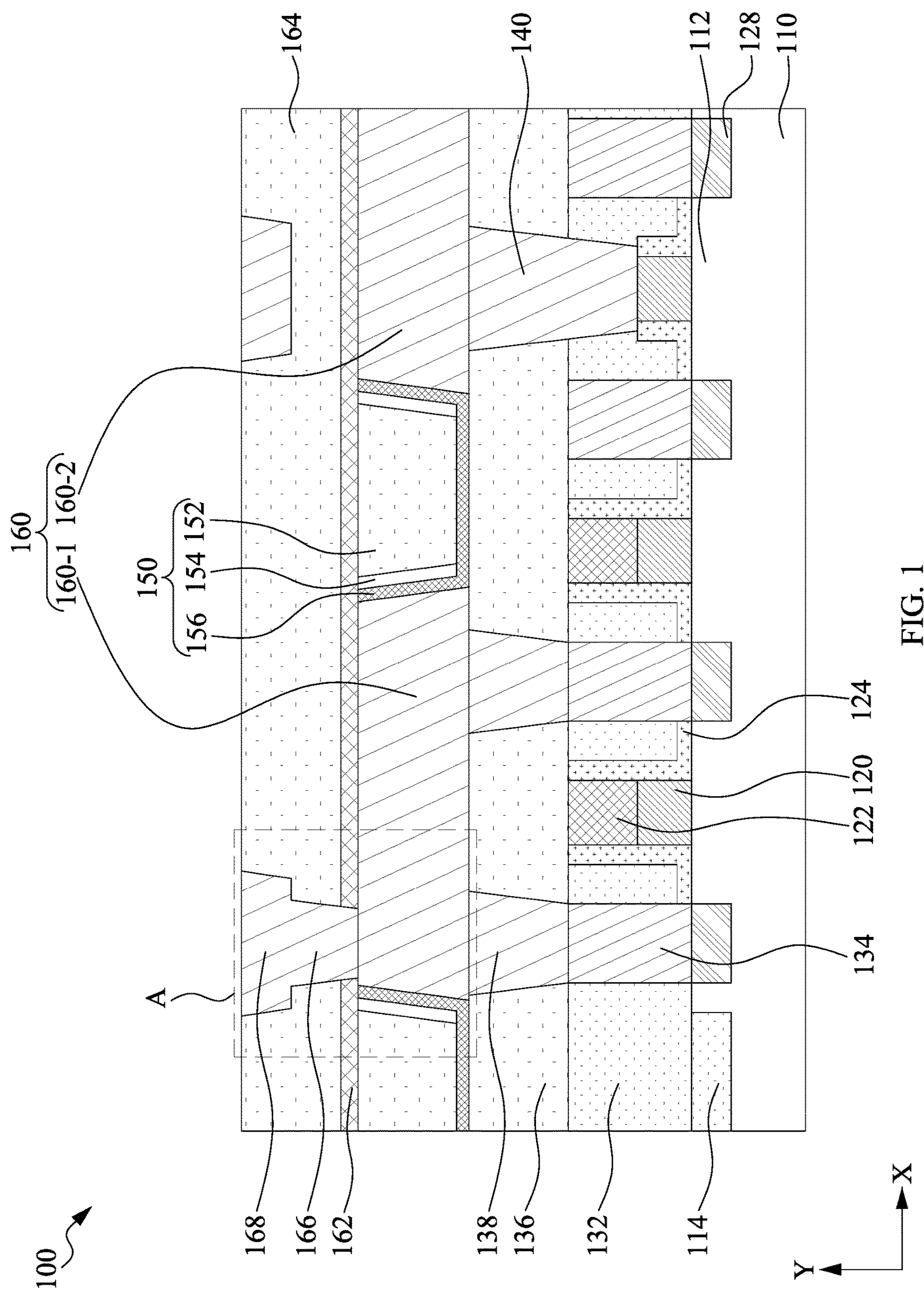
FIG. 1 illustrates a cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “upper,” “on” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as “first,” “second” and “third” describe various elements, components, regions, layers and/or sections, these elements, components, regions, layers and/or sections should not be limited by these terms. These terms may only be used to distinguish one element, component, region, layer or section from another. Terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “substantially,” “approximately” and “about” generally mean within a value or range that can be contemplated by people having ordinary skill in the art. Alternatively, the terms “substantially,” “approximately” and “about” mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms “substantially,” “approximately” or “about.” Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a cross-sectional view of a semiconductor device 100, in accordance with some embodiments of the present disclosure.

The semiconductor device 100 can include a substrate 110. In some embodiments, the substrate 110 is a semiconductor substrate, such as a bulk semiconductor substrate, a semiconductor-on-insulator (SOI) substrate, or the like, which may be doped (e.g., with a p-type or an n-type dopant) or undoped. The substrate 110 may be a semiconductor wafer, such as a silicon wafer. Generally, an SOI substrate includes a layer of a semiconductor material (e.g., silicon) formed on an insulator layer. The insulator layer may be, for example, a buried oxide (BOX) layer, a silicon oxide layer, or the like. The insulator layer is provided on a substrate, typically silicon or glass substrate. Other substrates, such as a multi-layered or gradient substrate may also be used. In some embodiments, the semiconductor material of the substrate 110 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Depending on the design requirements, the substrate 110 may be a P-type substrate, an N-type substrate or a combination thereof and may have doped regions therein. The substrate 110 may be configured for an NMOS device, a PMOS device, an N-type FinFET device, a P-type FinFET device, other kinds of devices (such as, multiple-gate transistors, gate-all-around transistors or nanowire transistors) or combinations thereof. In some embodiments, the substrate 110 for NMOS device or N-type FinFET device may include Si, SiP, SiC, SiPC, InP, GaAs, AlAs, InAs, InAlAs, InGaAs or combinations thereof. The substrate 110 for PMOS device or P-type FinFET device may include Si, SiGe, SiGeB, Ge, InSb, GaSb, InGaSb or combinations thereof.

In some embodiments in which the substrate 110 is configured for a FinFET device, the substrate 110 may include a plurality of fins 112. Each of the fins 112 may formed on a top surface of the substrate 110. Each of the fins 112 may protrude from a top surface of the substrate 110. In some embodiments, the substrate 110 has an isolation structure 114 formed on the substrate 110. Each of the fins 112 is exposed by the isolation structure 114. In some embodiments, the isolation structure is a shallow trench isolation (STI) structure. It is noted that the embodiments of the disclosure are not limited to a FinFET device, but may also be configured as a planar MOSFET or other suitable kinds of transistors.

The semiconductor device 100 can include a gate structure 120. The gate structure 120 may include a gate dielectric layer (not shown), and a gate electrode (not shown) disposed on the gate dielectric layer. The gate dielectric layer may include silicon oxide, silicon nitride, silicon oxynitride, high-k dielectric materials, or combinations thereof. The high-k material may have a dielectric constant ranging from about 4 to about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2Os$, $Y_2O_3$, STO, BTO, BaZrO, HfZrO, HfLaO, HfTaO, HfTiO, a combination thereof, or a suitable material. In alternative embodiments, the gate dielectric layer may optionally include a silicate such as HfSiO, LaSiO, AlSiO, a combination thereof, or a suitable material.

The gate electrode may include doped polysilicon, undoped polysilicon, or a metal-containing conductive material. In some embodiments, the gate electrode includes a work function metal layer and a metal filling layer on the work function metal layer. The work function metal layer may be an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The metal filling layer includes copper, aluminum, tungsten, or other suitable metallic materials. In some embodiments, the gate electrode may further include a liner layer, an interface layer, a seed layer, an adhesion layer, a barrier layer, a combination thereof or the like.

The semiconductor device 100 can include a dielectric layer 122. The dielectric layer 122 is disposed on the gate structure 120. The dielectric layer 122 may include a dielectric material, such as oxide, nitride, oxynitride or other suitable materials.

The semiconductor device 100 can include spacers 124. The spacers 124 are disposed on sidewalls of the gate structure 120 and the dielectric layer 122. The spacer 124 may be a single layer structure or a multi-layer structure. In some embodiments, the spacers 124 include $SiO_2$, SiN, SiCN, SiOCN, SiC, SiOC, SiON, or the like, or combinations thereof. In some embodiments, the fins 112 may be covered by the spacers 124.

The semiconductor device 100 can include source/drain regions 128 (or S/D regions 128). In some embodiments, the S/D regions 128 may be formed between the fins 112. The S/D regions 128 may be formed on opposite sides of the gate structure 120. In some embodiments, the S/D regions 128 are doped regions configured for a PMOS device or P-type FinFET and include p-type dopants, such as boron, $BF_2^+$, and/or a combination thereof. In alternative embodiments, the S/D regions 128 are doped regions configured for an NMOS device or N-type FinFET, and include n-type dopants, such as phosphorus, arsenic, and/or a combination thereof.

In some other embodiments, the S/D regions 128 are strained layers formed by an epitaxial growing process such as a selective epitaxial growing process. In some embodiments, recesses are formed in the fins 112 on sides of the gate structure 120, and the strained layers are formed by selectively growing epitaxy layers from the fins 112 exposed in the recesses. In some embodiments, the strained layers include silicon germanium (SiGe), SiGeB, Ge, InSb, GaSb, InGaSb or combinations thereof for a P-type MOS or FinFET device. In alternative embodiments, the strained layers include silicon carbon (SiC), silicon phosphate (SiP), SiCP, InP, GaAs, AlAs, InAs, InAlAs, InGaAs or a SiC/SiP multi-layer structure, or combinations thereof for an N-type MOS or FinFET device. In some embodiments, the strained layers may be optionally implanted with an N-type dopant or a P-type dopant as needed.

In some embodiments, the top surfaces of the S/D regions 128 may be substantially coplanar with the top surface of the fin 112. In some other embodiments, the S/D region 128 may extend upwardly along the sidewalls of the corresponding spacer 124, and have a top surface higher than the top surface of the fin 112. It is noted that the cross-sectional shape of the S/D regions 128 shown in the drawings is merely for illustration, and the disclosure is not limited thereto. The S/D regions 128 may have any suitable shape as needed. In some embodiments, the fin 112 may further include lightly doped regions formed therein. For example, lightly doped drain (LDD) regions may be formed adjacent to the S/D regions 128 in the fin 112.

The semiconductor device 100 can include a dielectric layer 132. The dielectric layer 132 is disposed on the fin 112 and laterally aside the gate structure 120 to cover sidewalls of the gate structure 120. The top surface of the dielectric layer 132 may be substantially coplanar with the top surfaces of the gate structure 120. In some embodiments, the dielectric layer 132 may also be referred to as a first dielectric layer or a first interlayer dielectric layer (ILD 1). The dielectric layer 132 may include silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 132 may include low-k dielectric material with a dielectric constant lower than 4, or extreme low-k (ELK) dielectric material with a dielectric constant lower than 2.5. In some embodiments, the low-k material includes a polymer based material, such as benzocyclobutene (BCB); or a silicon dioxide based material, such as hydrogen silsesquioxane (HSQ) or SiOF. The dielectric layer 132 may be a single layer structure or a multi-layer structure.

The semiconductor device 100 can include contacts 134. The contacts 134 are formed in the dielectric layer 132 and electrically connected to the S/D regions 128. The contact 134 can include a barrier layer (not shown) and a conductive layer (not shown) on the barrier layer. The barrier layer may include titanium, tantalum, titanium nitride, tantalum nitride, manganese nitride or a combination thereof. The conductive layer may include metal, such as tungsten (W), copper (Cu), Ru, Ir, Ni, Os, Rh, Al, Mo, Co, alloys thereof, combinations thereof or any metallic material with suitable resistance and gap-fill capability.

The semiconductor device 100 can include a dielectric layer 136. The dielectric layer 136 is disposed on the dielectric layer 132. The dielectric layer 136 can cover the gate structure 120. In some embodiments, the dielectric layer 136 may also be referred to as a second dielectric layer or a second interlayer dielectric layer (ILD 2). In some embodiments, the material of the dielectric layer 136 may be the same as or different from the material of the dielectric layer 132.

The semiconductor device 100 can include conductive vias 138 and 140. In some embodiments, the conductive via 138 penetrates the dielectric layer 136 and is electrically connected to the contact 134. In some embodiments, the conductive via 140 penetrates the dielectric layer 136 and a portion of the dielectric layer 132. The conductive via 140 is electrically connected to the gate structure 120. In some embodiments, the conductive via 138 includes a barrier layer (not shown) and a conductor (not shown) on the barrier layer. The top surface of the conductive via 138 may be substantially coplanar with the top surface of the dielectric layer 136. The material of the conductive via 138 is similar to, and may be the same as or different from that of the contact 134. The top surfaces of the conductive via 140 may be substantially coplanar with the top surface of the dielectric layer 136. The material of the conductive via 140 may be the same as or different from that of the contact 134. In some other embodiments, some of the conductive via 138 may be electrically connected to both the contact 134 and the gate structure 120. In some embodiments, the conductive via 138 may be referred to as "VD," and the conductive via 140 may be referred to as "VG."

The semiconductor device 100 can include dielectric structures 150. In some embodiments, the dielectric structures 150 are disposed on the dielectric layer 136. In some embodiments, the dielectric structure 150 may also be referred to as a third dielectric layer or a third interlayer dielectric layer (ILD 3). In some embodiments, the dielectric structure 150 includes a dielectric layer 152, a leakage-improving component 154 and a dielectric layer 156. In some embodiments, the dielectric structure 150 is tapered toward the −Y direction (i.e., the negative Y direction). That is, the dielectric structure 150 is tapered toward the substrate 110.

In some embodiments, the dielectric layer 152 is surrounded by the leakage-improving component 154. In some embodiments, the dielectric layer 152 is surrounded by the dielectric layer 156. In some embodiments, the bottom surface of the dielectric layer 152 is in contact with the dielectric layer 156. The dielectric layer 152 may include low-k dielectric material or ELK (extreme low-k) dielectric material. The low-k dielectric material may include silicon oxide, carbon-containing oxide such as SiOC, silicate glass, TEOS oxide, un-doped silicate glass, or doped silicon oxide such as BPSG, FSG, PSG, BSG, combinations thereof and/or other suitable dielectric materials.

In some embodiments, the leakage-improving component 154 may be surrounded by the dielectric layer 156. In some embodiments, the leakage-improving component 154 is disposed on the sidewall of the dielectric layer 156. In some embodiments, the dielectric constant of the leakage-improving component 154 is less than that of the dielectric layer 152. In some embodiments, the dielectric constant of the leakage-improving component 154 is less than that of the dielectric layer 156. In some embodiments, the leakage-improving component 154 may include air. The leakage-improving component 154 may be an air gap, which has a dielectric constant about 1. In some embodiments, the leakage-improving component 154 may have a ring-shaped profile surrounding the dielectric layer 152 from a top view (not shown). In some embodiments, an aperture of the leakage-improving component 154 is tapered along the −Y direction. That is, the aperture of the leakage-improving component 154 is tapered toward the substrate 110. In some embodiments, from a top view of the semiconductor device 100 (not shown), a radius of the leakage-improving component 154 may be decreased along the −Y direction.

In some embodiments, the dielectric layer 156 surrounds the leakage-improving component 154 and the dielectric layer 152. The dielectric layer 156 may define a recess. The dielectric layer 156 may define a recess from the conductive layer 160. The dielectric layer 152 and the leakage-improving component 154 may be located within the recess. In some embodiments, the recess of the dielectric layer 156 is tapered toward the −Y direction. That is, the recess of the dielectric layer 156 is tapered toward the substrate 110. In some embodiments, the dielectric layer 156 may include low-k dielectric material or ELK dielectric material. In some embodiments, the dielectric layer 156 may include nitride, oxide, carbide, oxynitride, metal oxide, or other suitable materials.

The semiconductor device 100 can include a conductive layer 160. The conductive layer 160 may include a barrier layer (not shown) and a conductive layer (not shown) on the barrier layer. The material and/or the composition of the conductive layer 160 may be the same as or similar to those of the contact 134. In some embodiments, the conductive layer 160 may be surrounded by the dielectric structure 150. In some embodiments, the conductive layer 160 is in contact with the dielectric layer 156 of the dielectric structure 150. In some embodiments, the dielectric layer 156 is disposed on the sidewall of the conductive layer 160. In some embodiments, the conductive layer 160 is spaced apart from the leakage-improving component 154 of the dielectric structure 150. In some embodiments, the conductive layer 160 is spaced apart from the dielectric layer 152 of the dielectric structure 150. In some embodiments, the conductive layer 160 may be referred to as a zero metal layer (M0). In some embodiments, the conductive layer 160 may include a portion 160-1 electrically connected to the contact 134 and the conductive via 138. In some embodiments, the conductive layer 160 may include a portion 160-2 electrically connected to the gate structure 120 and the conductive via 140. In some embodiments, each of the portions 160-1 and 160-2 is tapered along the +Y direction. That is, each of the portions 160-1 and 160-2 is tapered along a direction far away from the gate structure 120 or the substrate 110.

The semiconductor device 100 can include an etching stop layer 162. In some embodiments, the etching stop layer 162 may cover the dielectric layer 152, the leakage-improving component 154, the dielectric layer 156, and the conductive layer 160. The material of the conductive layer 160 may be different from that of the dielectric layer 132. In some embodiments, the etching stop layer 162 includes SiN, SiC, SiOC, SiON, SiCN, SiOCN, or the like, or combinations thereof.

The semiconductor device 100 can include a dielectric layer 164. The dielectric layer 164 may be disposed on the etching stop layer 162. In some embodiments, the dielectric layer 164 may also be referred to as a fourth dielectric layer or a fourth interlayer dielectric layer (ILD 4). In some embodiments, the material of the dielectric layer 164 may be the same as or different from the material of the dielectric layer 132.

The semiconductor device 100 can include a conductive via 166. In some embodiments, the conductive via 166 penetrates a portion of the dielectric layer 164 and is electrically connected to the conductive layer 160. Although FIG. 1 illustrates that the conductive via 166 is electrically connected to the portion 160-1 only, it is appreciated that the conductive via 166 can be electrically connected to the portion 160-2. The material of the conductive via 166 is similar to, and may be the same as or different from that of the contact 134. In some embodiments, the conductive via 166 may be referred to as a zero via (V0).

The semiconductor device 100 can include a conductive layer 168. In some embodiments, the conductive layer 168 penetrates a portion of the dielectric layer 164 and is electrically connected to the conductive via 166. The material of the conductive layer 168 is similar to, and may be the same as or different from that of the conductive via 166. In some embodiments, the conductive layer 168 may be referred to as the first metal layer (M1).

Figure 2A:
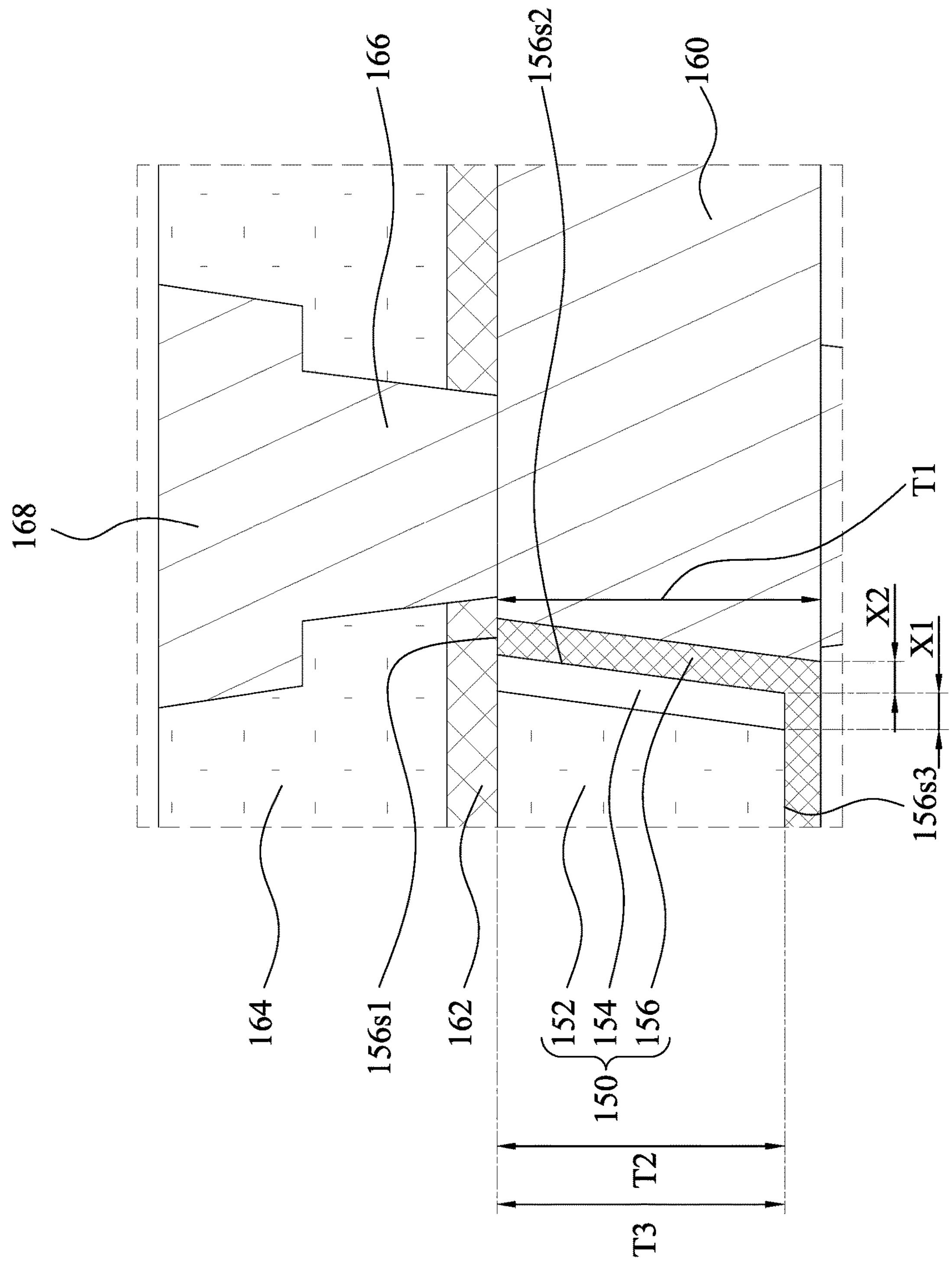
FIG. 2A illustrates an enlarged view of region A of the semiconductor device shown in FIG. 1, in accordance with some embodiments of the present disclosure.

FIG. 2A illustrates an enlarged view of region A of the semiconductor device 100 shown in FIG. 1, in accordance with some embodiments of the present disclosure.

As shown in FIG. 2A, the dielectric layer 156 includes a surface **156*s*1 (or a top surface), a surface 156*s*2 (or a lateral surface), and a surface 156*s*3 (or a lower surface). The surface 156*s*2 and the surface 156*s*3 may define the recess of the dielectric layer 156, and the surface 156*s*3 may be defined as a bottom of the recess. In some embodiments, the surface 156*s*1 of the dielectric layer 156 is fully covered by the etching stop layer 162. In some embodiments, the surface 156*s*1 of the dielectric layer 156 is spaced apart from the conductive via 166. The surface 156*s*2 of the dielectric layer 156 has a thickness (or length) T1 along (or projected on) the Y direction. The leakage-improving component 154 has a thickness (or length) T2 along (or projected on) the Y direction. In some embodiments, the thickness T1 is greater than the thickness T2. The dielectric layer 152 has a thickness (or length) T3 along (or projected on) the Y direction. In some embodiments, the thickness of the T2 may be substantially equal to the thickness T3. In some embodiments, a portion of the dielectric layer 156 is exposed to the leakage-improving component 154. In some embodiments, a portion of the surface 156*s*3 of the dielectric layer 156 is exposed to the space of the leakage-improving component 154**.

The leakage-improving component 154 may have a width X1 along the X direction. In some embodiments, width X1 of the leakage-improving component 154 may range from about 1 nm to about 5 nm. When width X1 is greater than or equal to about 1 nm, the leakage-improving component 154 may assist in reducing capacitance between portions 160-1 and 160-2 of the conductive layer 160. When width X1 is less than or equal to about 5 nm, the space of the leakage-improving component 154 may be free from being filled with the etching stop layer 162.

The dielectric layer 156 may have a width X2 along the X direction. In some embodiments, the dielectric layer 156 may range from about 2 nm to about 5 nm. When the X2 is greater than or equal to about 2 nm, the leakage-improving component 154 may be free from being filled with the conductive via 166, even if the overlay of lithography operation, for patterning the dielectric layer 164, shifts.

In this embodiment, since the leakage-improving component 154 may have a relatively low dielectric constant, the leakage between the portion 160-1 and the portion 160-2 of the conductive layer 160 may be improved. Further, since the leakage-improving component 154 may reduce capacitance, RC delay issues can be improved.

Figure 2B:
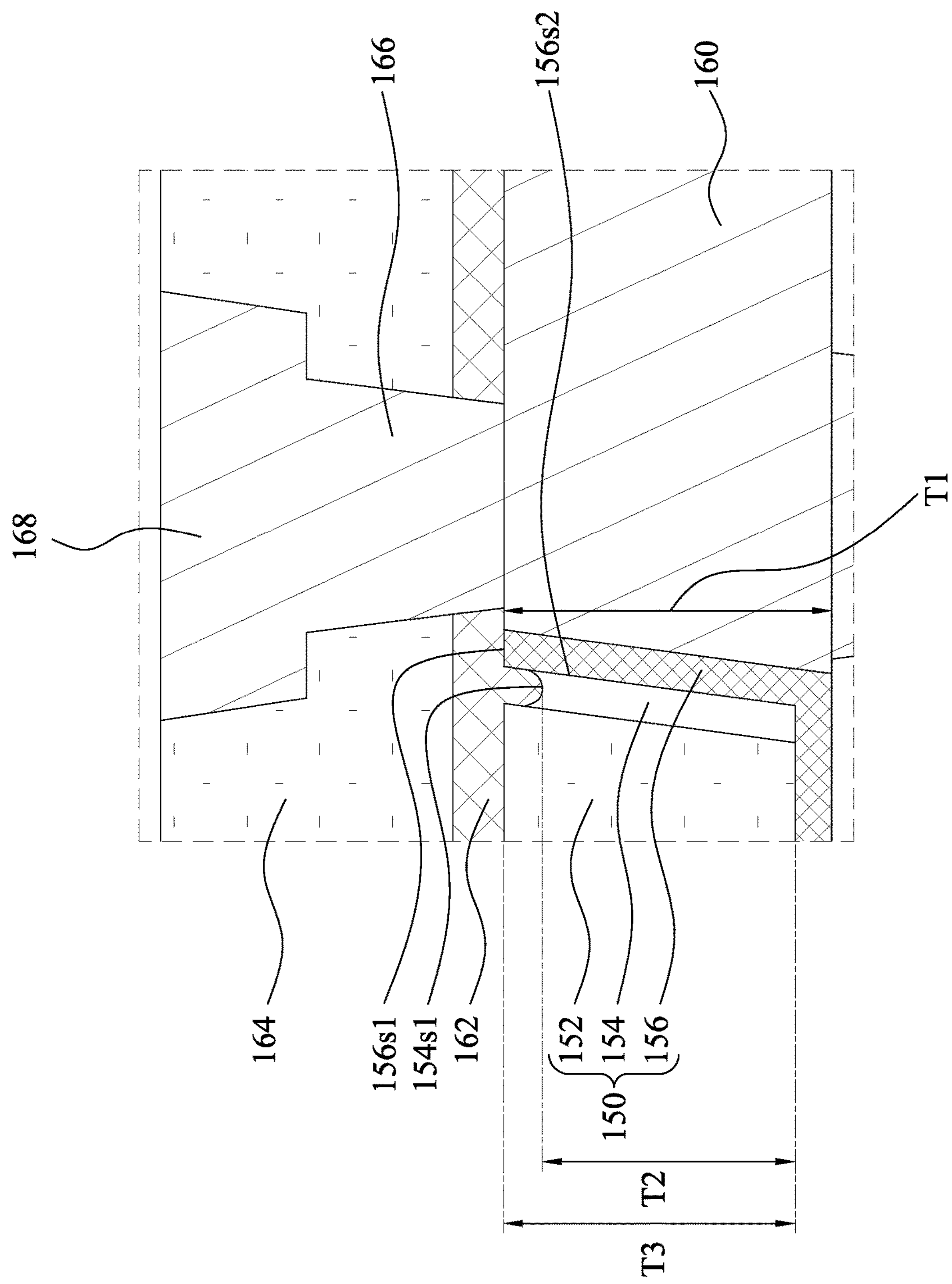
FIG. 2B illustrates a cross-sectional view of a semiconductor device, in accordance with some embodiments of the present disclosure.

FIG. 2B illustrates a cross-sectional view of a semiconductor device, in accordance with some embodiments of the present disclosure.

In some embodiments, the etching stop layer 162 may fill in a portion of the space of the leakage-improving component 154 of the dielectric structure 150. In some embodiments, the etching stop layer 162 may be in contact with an upper portion of the surface **156*s*2 of the dielectric layer 156. A lower portion of the surface 156*s*2 of the dielectric layer 156 is not in contact with the etching stop layer 162. In some embodiments, a portion of the sidewall of the dielectric layer 152 is in contact with the etching stop layer 162. In some embodiments, thickness T2 of the leakage-improving component 154 is less than thickness T3 of the dielectric layer 152. In some embodiments, the top surface of the leakage-improving component 154 is lower than that of the dielectric layer 156. In some embodiments, the top surface of the leakage-improving component 154 is lower than that of the dielectric layer 152**.

Figure 3:
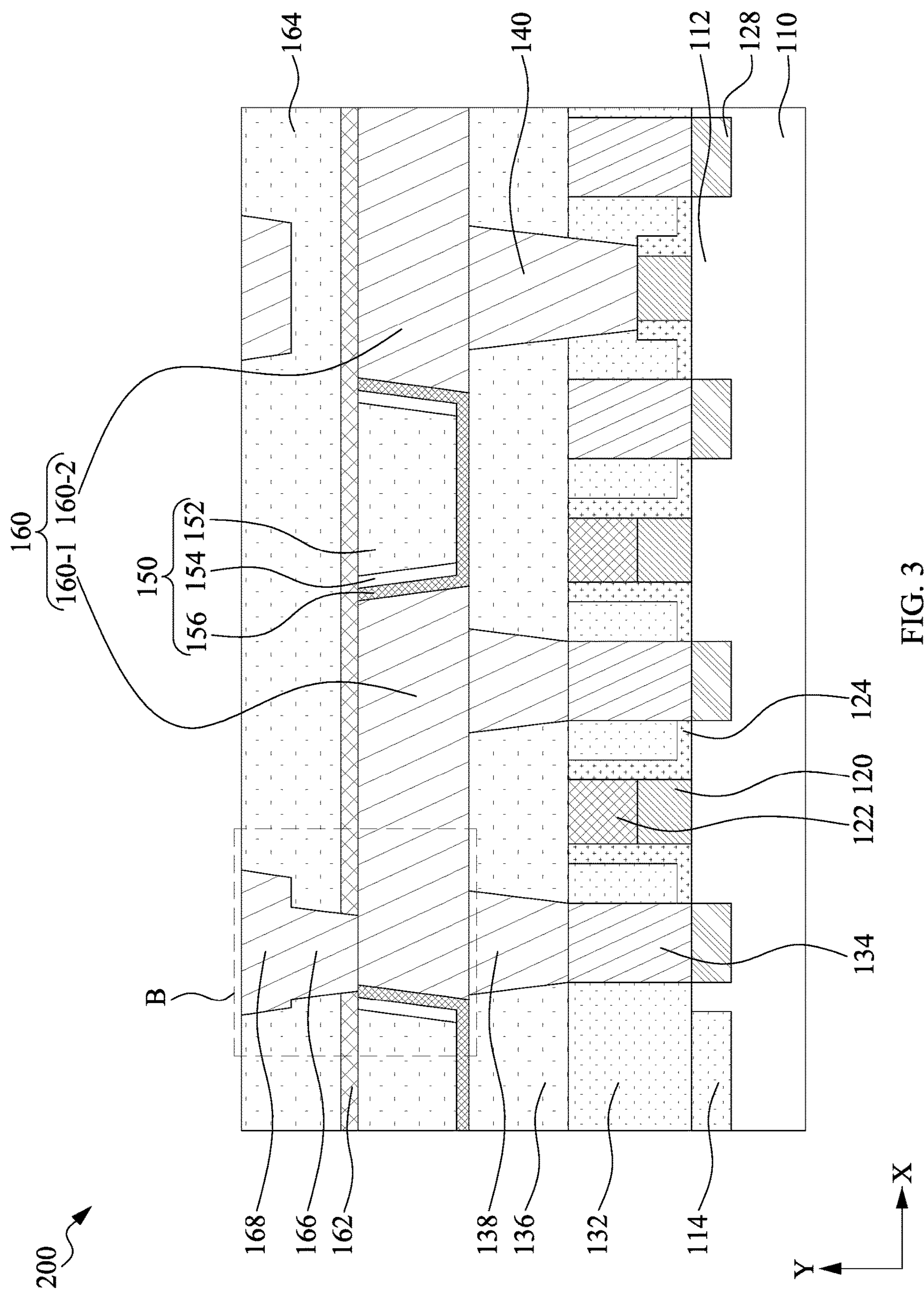
FIG. 3 illustrates a cross-sectional view of a semiconductor device, in accordance with some embodiments of the present disclosure.

FIG. 3 illustrates a cross-sectional view of a semiconductor device 200, in accordance with some embodiments of the present disclosure. The semiconductor device 200 has a structure similar to that of the semiconductor device 100. One of the differences between the semiconductor devices 100 and 200 is that a portion of the top surface of the dielectric layer 156 is uncovered by the etching stop layer 162.

Figure 4:
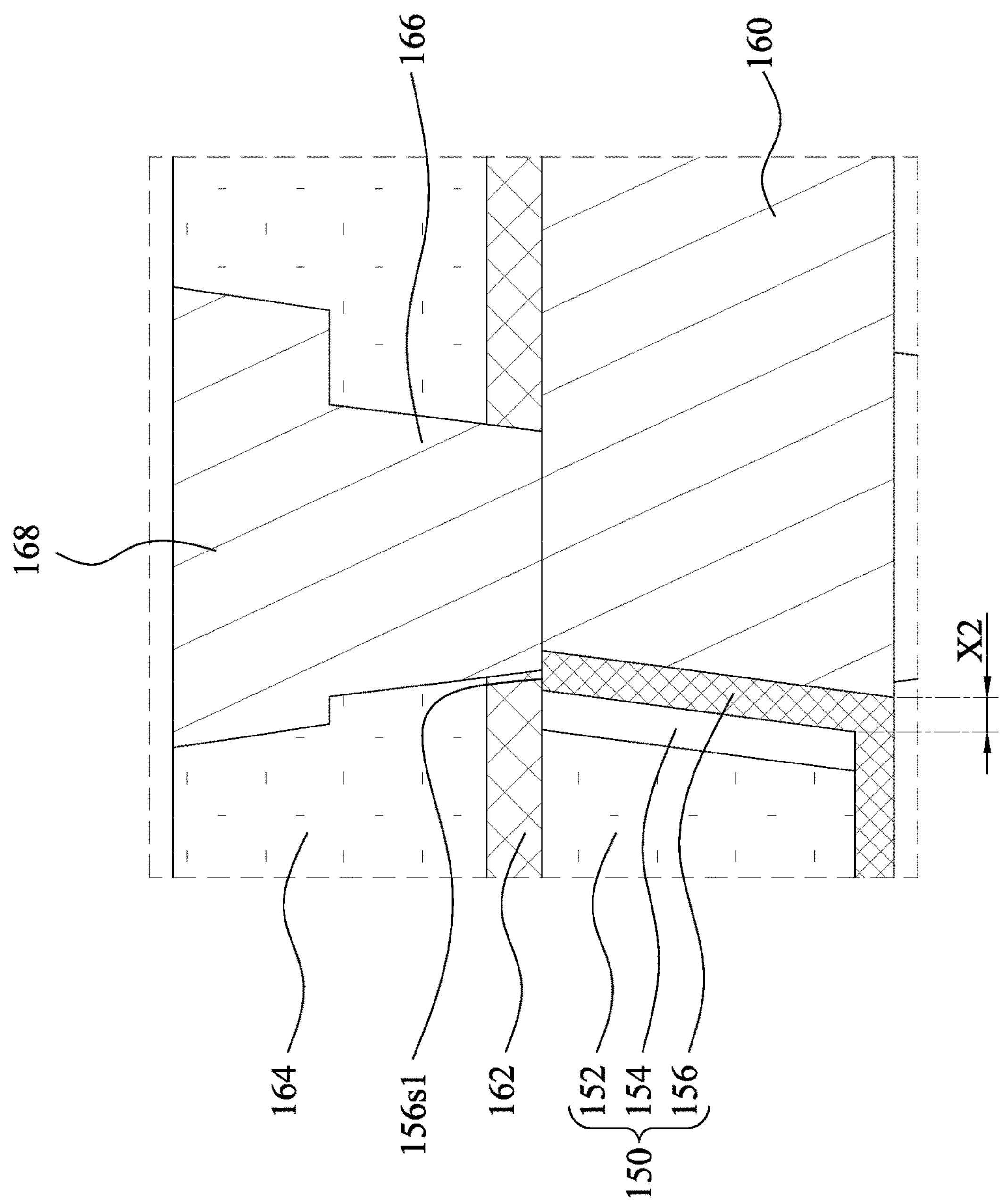
FIG. 4 illustrates an enlarged view of region B of the semiconductor device shown in FIG. 3, in accordance with some embodiments of the present disclosure.

FIG. 4 illustrates an enlarged view of region B of the semiconductor device 200 shown in FIG. 3, in accordance with some embodiments of the present disclosure. In some embodiments, a portion of the surface 156*s*1 of the dielectric layer 156 is in contact with the conductive via 166. In some embodiments, the leakage-improving component 154 is spaced apart from the conductive via 166. If an overlay of the lithography operation for patterning the dielectric layer 164 shifts, the conductive via 166 may shift with a distance of less than 2 nm. Since the dielectric layer 156 has width W2 greater than or equal to 2 nm, the formation of the dielectric layer 156 may prevent the conductive via 166 from filling in the space of the leakage-improving component 154.

Figure 5A:
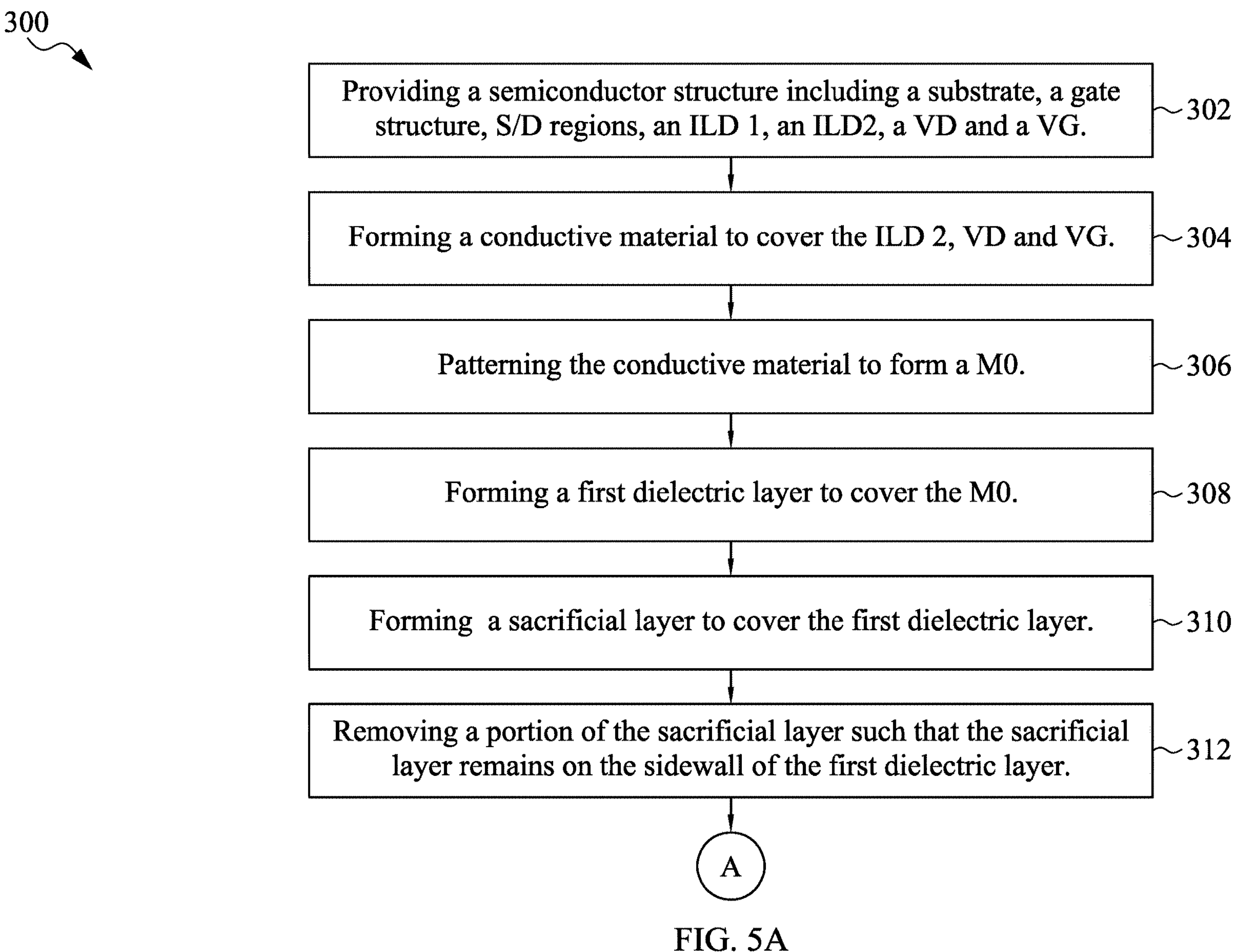
FIG. 5A and FIG. 5B are flow charts illustrating a method for manufacturing a semiconductor device according to various aspects of the present disclosure.
Figure 5B:
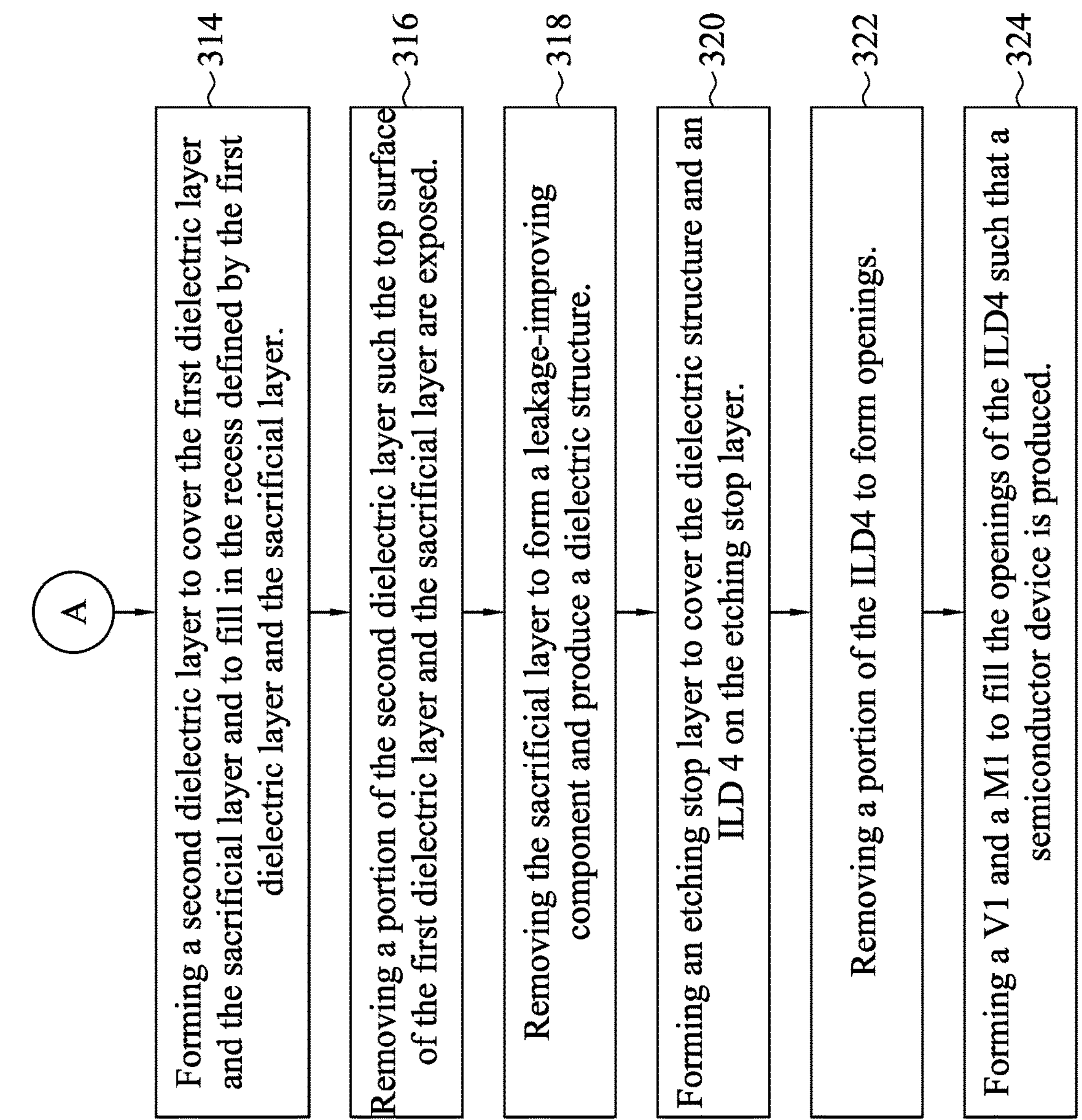

FIG. 5A and FIG. 5B are flow charts illustrating a method 300 for manufacturing a semiconductor device according to various aspects of the present disclosure.

Referring to FIG. 5A, the method 300 begins with operation 302 in which a semiconductor structure is provided. The semiconductor structure may include a substrate, a gate structure, S/D regions, an ILD 1, an ILD2, a VD and a VG. The method 300 continues with operation 304 in which a conductive material is formed to cover the ILD 2, VD and VG. The method 300 continues with operation 306 in which the conductive material is patterned such that the M0 is formed. The method 300 continues with operation 308 in which a first dielectric layer is formed to cover the M0. The method 300 continues with operation 310 in which a sacrificial layer is formed to cover the first dielectric layer. The method 300 continues with operation 312 in which a portion of the sacrificial layer is removed such that the sacrificial layer remains on the sidewall of the first dielectric layer.

Referring to FIG. 5B, the method 300 continues with operation 314 in which a second dielectric layer is formed to cover the first dielectric layer and the sacrificial layer and to fill in the recess defined by the first dielectric layer and the sacrificial layer. The method 300 continues with operation 316 in which a portion of the second dielectric layer is removed such that the second dielectric layer in the recess remains, and the top surfaces of the first dielectric layer and the sacrificial layer are exposed. The method 300 continues with operation 318 in which the sacrificial layer is removed to form a leakage-improving component. As a result, a dielectric structure (or ILD3) is produced. The method 300 continues with operation 320 in which an etching stop layer is formed to cover the dielectric structure. Further, an ILD 4 is formed on the etching stop layer. The method 300 continues with operation 322 in which a portion of the ILD4 is removed to form openings. The method 300 continues with operation 324 in which a V1 and an M1 are formed to fill the openings of the ILD4 such that a semiconductor device is produced.

The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method.

FIG. 6A, FIG. 6B, FIG. 6C, FIG. 6D, FIG. 6E, FIG. 6F, FIG. 6G, FIG. 6H, FIG. 6I, FIG. 6J, FIG. 6K, and FIG. 6L illustrate various stages of manufacturing a semiconductor device, in accordance with some embodiments of the present disclosure.

Figure 6A:
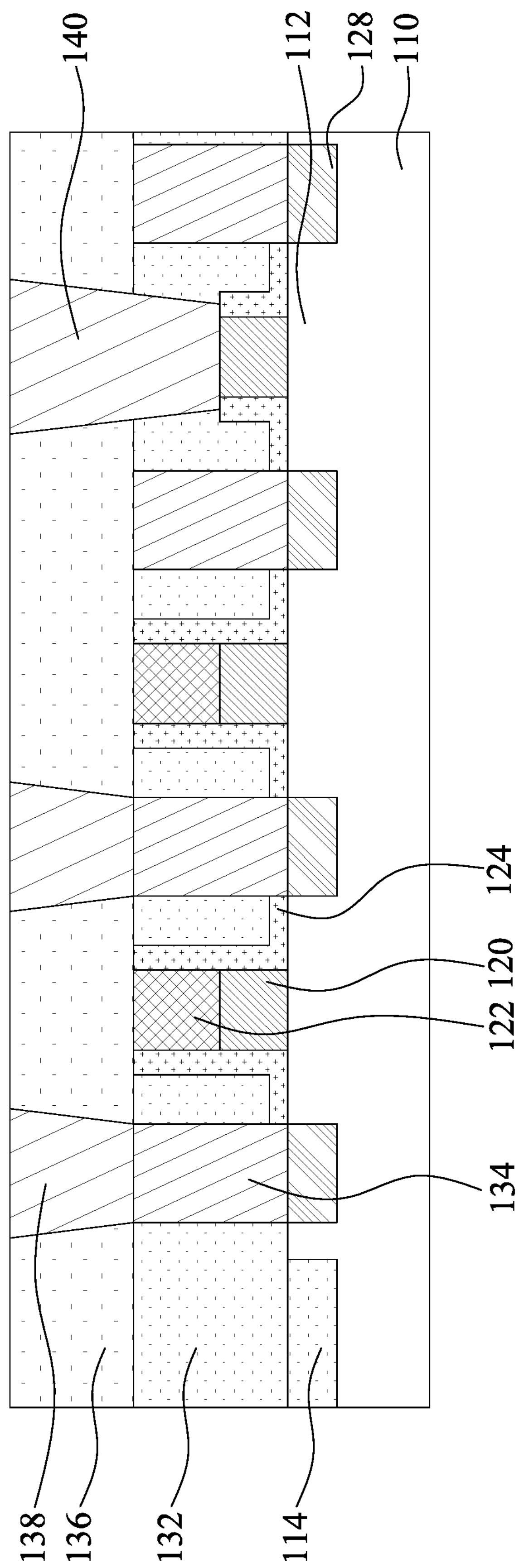
FIG. 6A, FIG. 6B, FIG. 6C, FIG. 6D, FIG. 6E, FIG. 6F, FIG. 6G, FIG. 6H, FIG. 6I, FIG. 6J, FIG. 6K, and FIG. 6L illustrate various stages of manufacturing a semiconductor device, in accordance with some embodiments of the present disclosure.

Referring to FIG. 6A, a substrate 110 is provided. A plurality of fins 112 may protrude from a top surface of the substrate 110. An isolation structure 114 may cover the substrate 110, and the fins 112 can be exposed by the isolation structure 114. A plurality of gate structures 120 are formed on the fins 112. Dielectric layers 122 are formed on the top surface of the gate structure 120. Spacers 124 may be formed on the two opposite sidewalls of the gate structure 120. A plurality of the S/D regions 128 may be formed in the fins 112. The S/D regions 128 may be formed by an epitaxial growing process such as a selective epitaxial growing process. A dielectric layer 132 is formed to cover the substrate 110 and the fins 112. The dielectric layer 132 may be formed by chemical vapor deposition (CVD), plasma enhanced CVE (PECVD), flowable CVD (FCVD), spin coating or the like. An etching process may be performed to form a plurality of openings of the dielectric layer 132. Contacts 134 may be formed to fill the openings of the dielectric layer 132 by sputtering, CVD, PVD, electrochemical plating (ECP), electrodeposition (ELD), ALD, or the like, or combinations thereof. A dielectric layer 136 is formed to cover the gate structure 120, the dielectric layer 132, and the contact 134. An etching stop layer (not shown) is formed and patterned to define the location of the VD and VG. An etching process is performed to form a plurality of openings defined by the dielectric layers 136 and/or 132. Conductive vias 138 and 140 are formed to fill the openings defined by the dielectric layers 136 and/or 132.

Figure 6B:
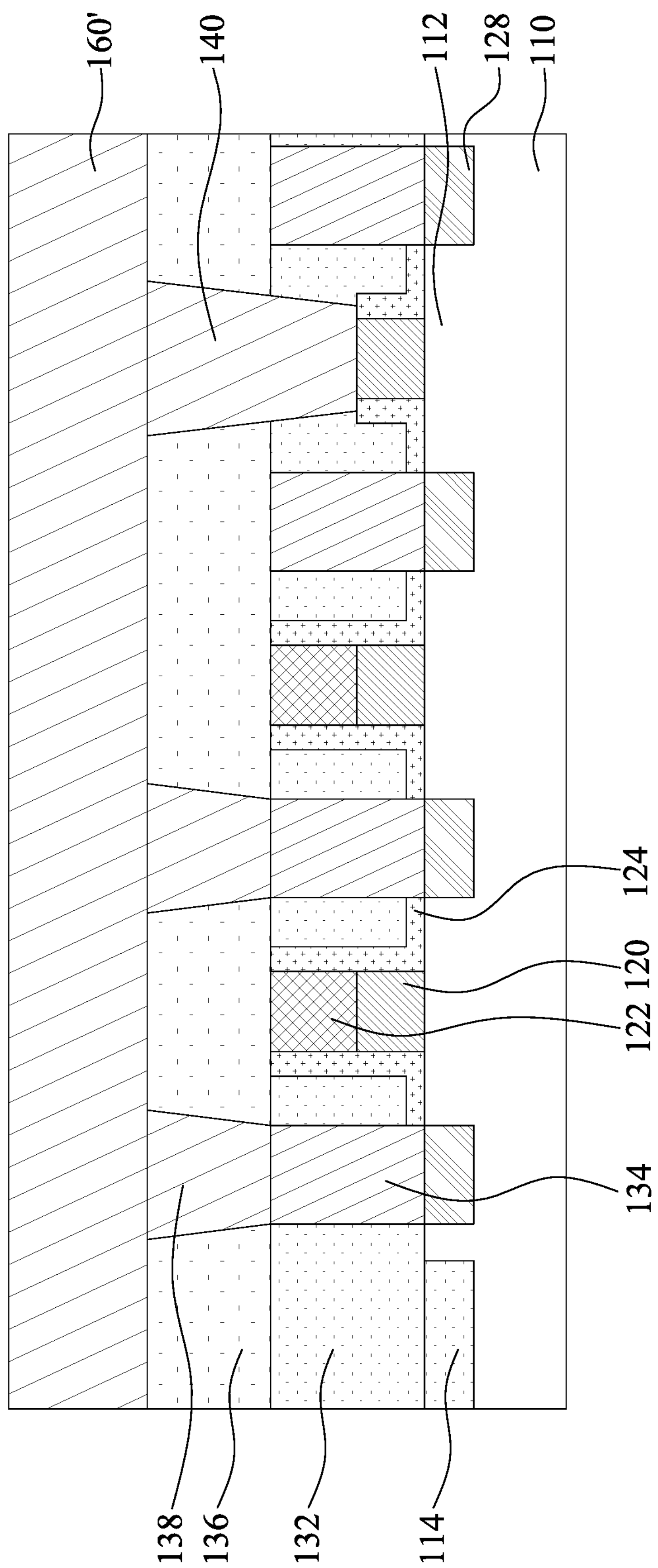

Referring to FIG. 6B, a conductive material 160' may be formed to cover the dielectric layer 136, the conductive via 138, and the conductive via 140. The conductive material 160' may be formed by sputtering, CVD, PVD, ECP, ELD, ALD, or the like or combinations thereof.

Figure 6C:
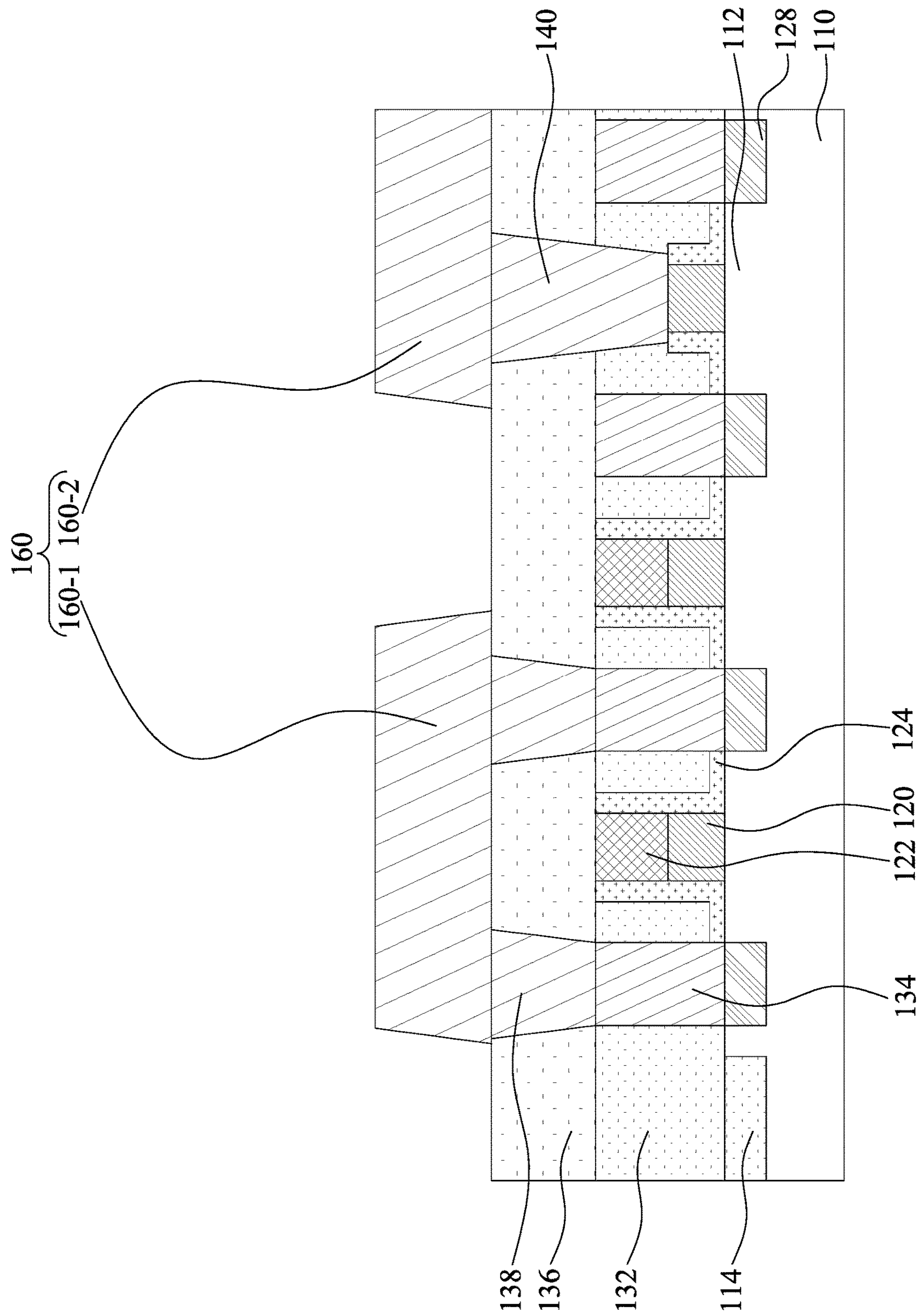

Referring to FIG. 6C, the conductive material 160' is patterned such that the conductive layer 160, including the portions 160-1 and 160-2, is formed. An etching process is performed to etch the conductive layer 160 such that each of the portions 160-1 and 160-2 is tapered along a direction far away from the substrate 110. Further, the conductive layer 160 may define a plurality of recesses exposing the dielectric layer 136. In some embodiments, a mask structure (not shown), such as oxide or other suitable materials, may be formed on the conductive material 160' to define the pattern of the conductive layer 160. It is appreciated that the mask structure may remain in this stage and be removed at subsequent stages.

Figure 6D:
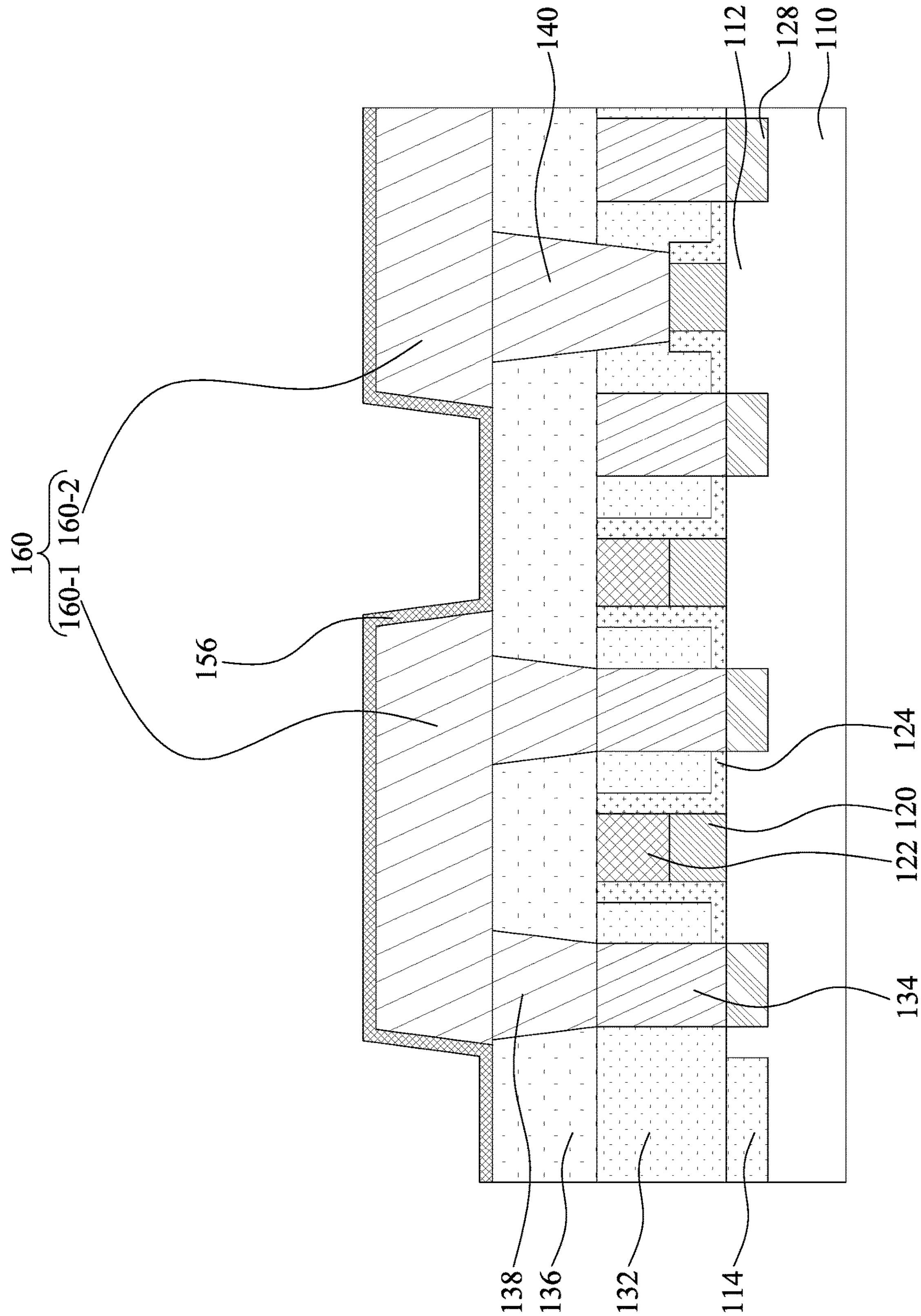

Referring to FIG. 6D, a dielectric layer 156 is formed to cover the top surface and the sidewall of the conductive layer 160 as well as the top surface of the dielectric layer 136. In some embodiments, the dielectric layer 156 may be formed by a deposition process, such as an ALD or other suitable processes.

Figure 6E:
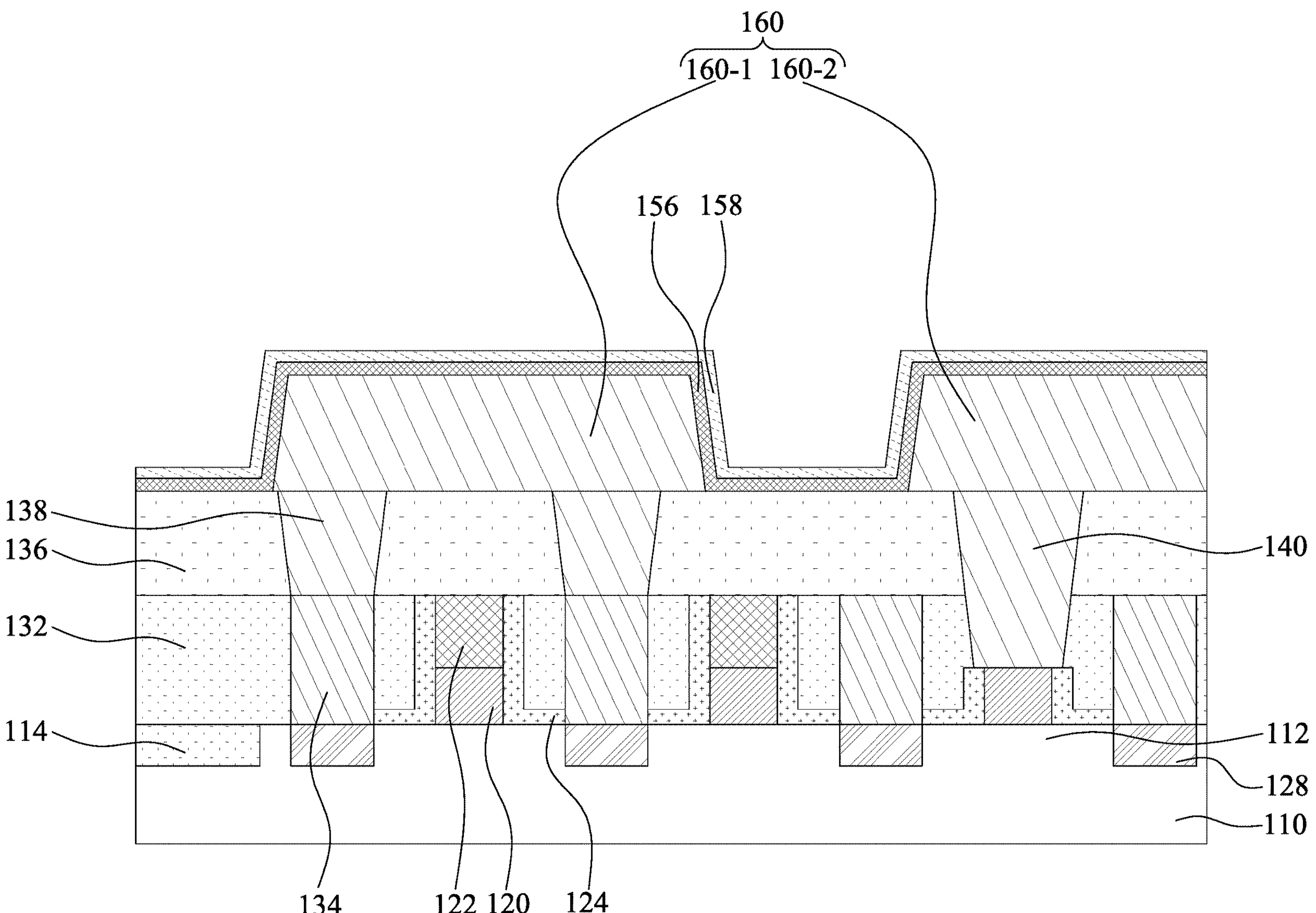

Referring to FIG. 6E, a sacrificial layer 158 is formed to cover the top surface, the lower surface, and the sidewall of the dielectric layer 156. In some embodiments, the sacrificial layer 158 can include a semiconductor material. In some embodiments, the semiconductor material can include silicon or other suitable materials. The sacrificial layer 158 may also include a dielectric material, such as metal oxide. Metal oxide may include aluminum oxide (AlO), but the disclosure is not limited thereto. In some embodiments, the sacrificial layer 158 is formed by a deposition process such as CVD, ALD, or the like, or combinations thereof. In some embodiments, the thickness of the sacrificial layer 158 ranges from about 1 nm to about 5 nm.

Figure 6F:
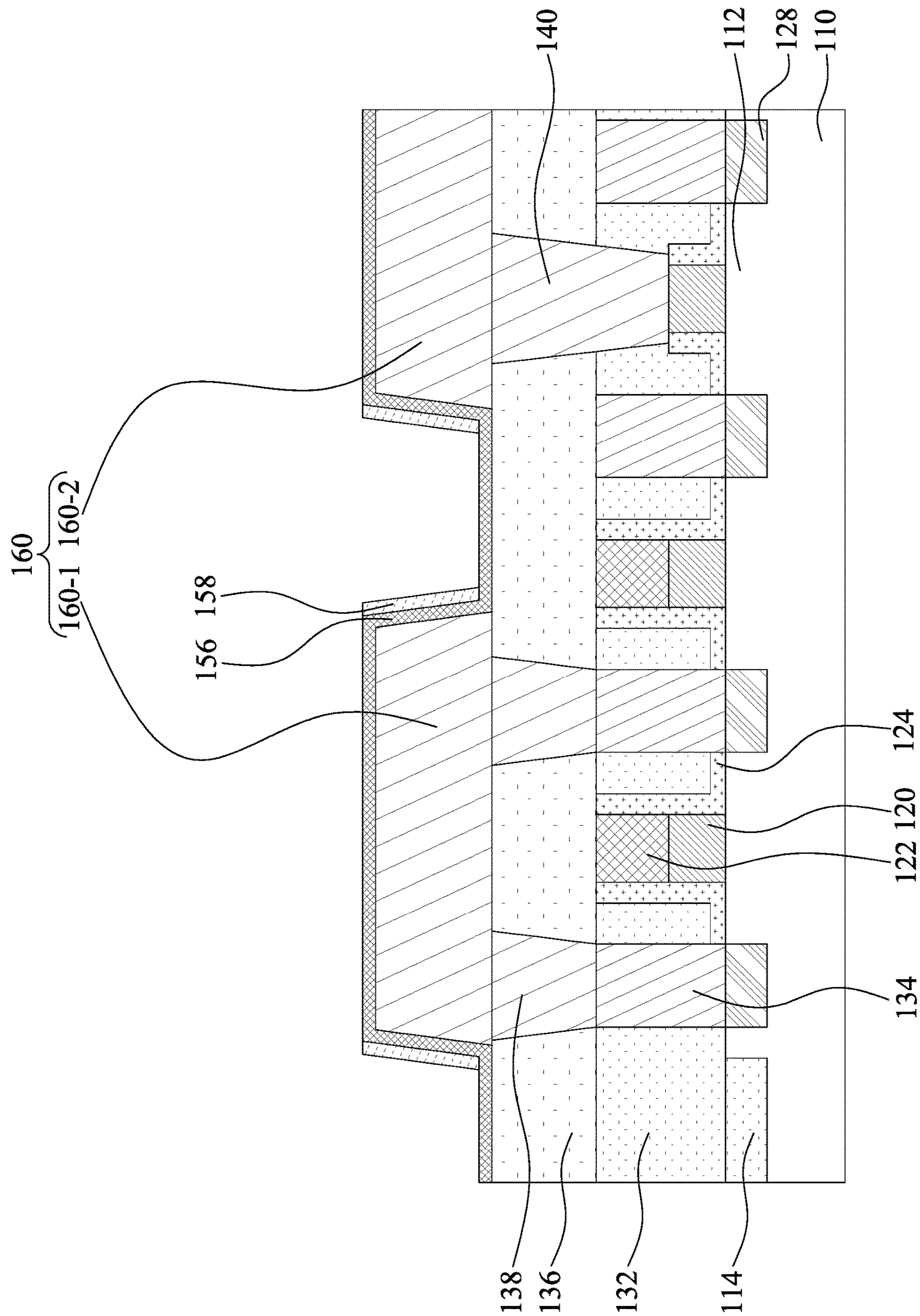

Referring to FIG. 6F, an etching process may be performed to remove a portion of the sacrificial layer 158. In some embodiments, the portions, in contact with the top surface and the lower surface of the dielectric layer 156, of the sacrificial layer 158 are removed, and the other portion of the sacrificial layer 158, in contact with the sidewall of the dielectric layer 156, remains. The etching process may include, for example, dry etching.

Figure 6G:
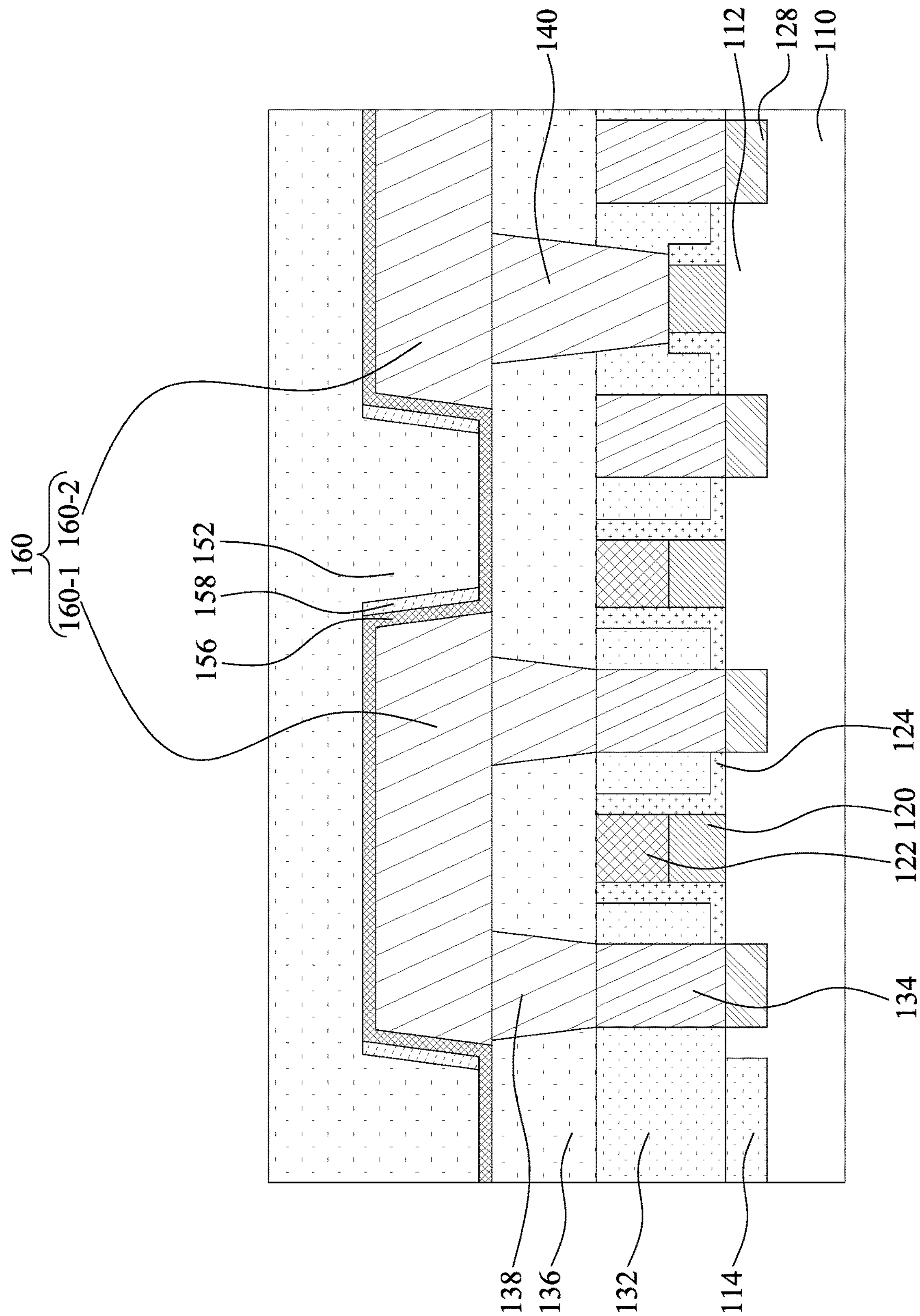

Referring to FIG. 6G, a dielectric layer 152 may be formed to cover the sacrificial layer 158, and fill the recess defined by the sacrificial layer 158. The sacrificial layer 158 may be formed by CVD, ALD or other suitable processes.

Figure 6H:
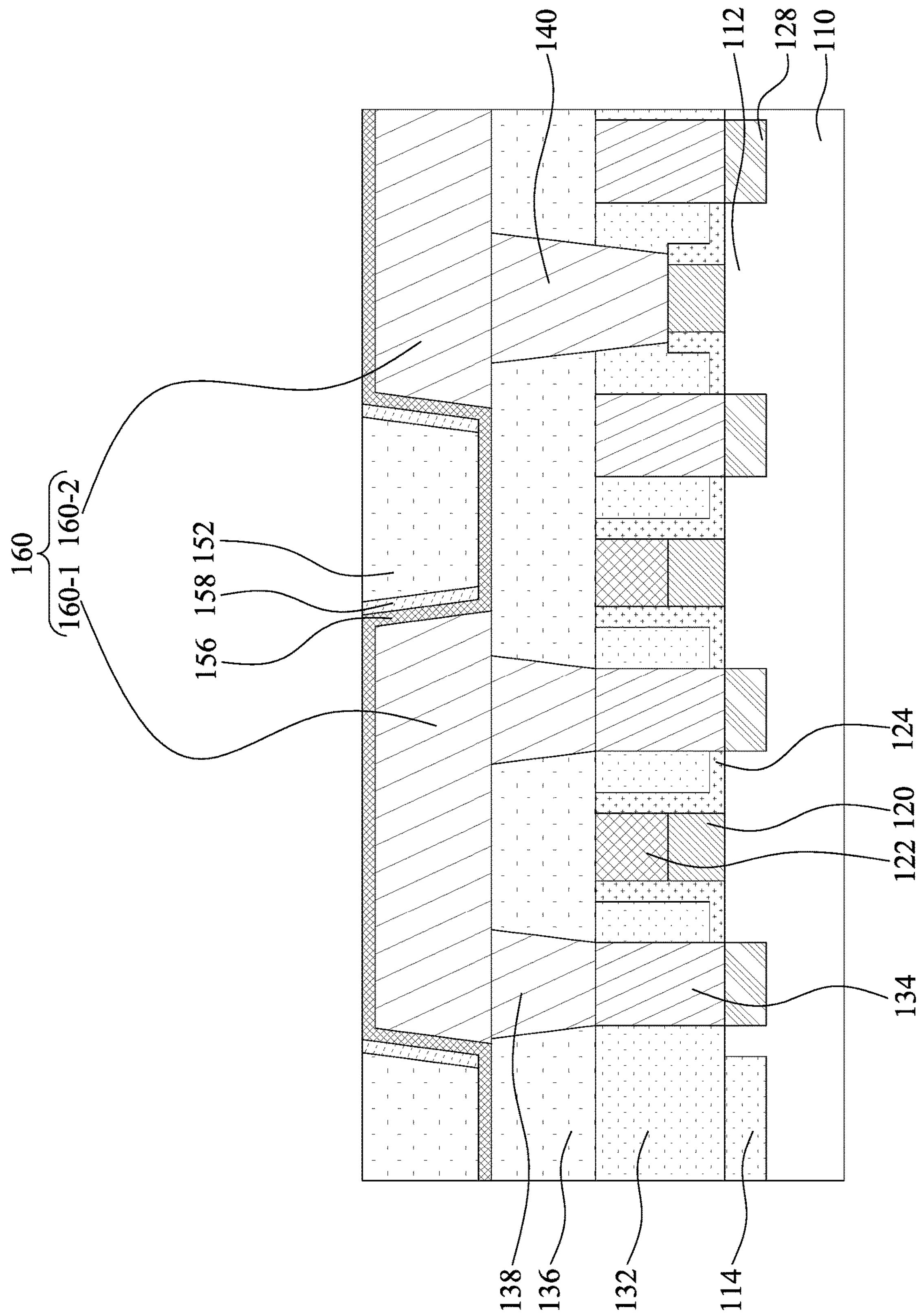

Referring to FIG. 6H, a planarization process such as chemical mechanical polishing (CMP) is performed to remove excess portions of the dielectric layer 152 such that the dielectric layer 156 and the sacrificial layer 158 are exposed.

Figure 6I:
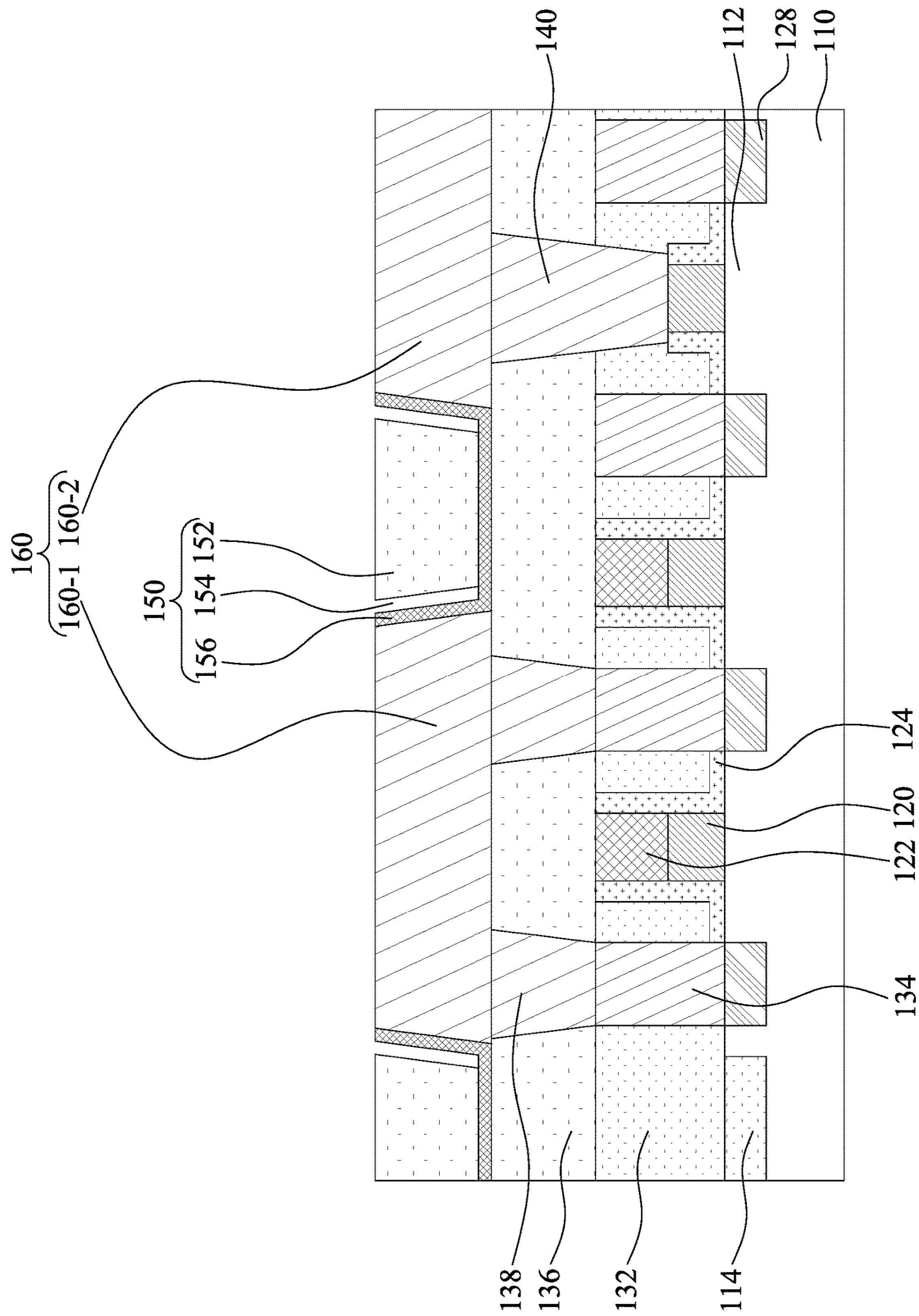

Referring to FIG. 6I, the sacrificial layer 158 is removed by an etching process such as a dry etching process, a wet etching process or a combination thereof, so as to form a leakage-improving component 154 (or an air gap) at the location previously occupied by the sacrificial layer 158. The leakage-improving component 154 is laterally located between the dielectric layer 152 and the dielectric layer 156. As a result, a dielectric structure (or ILD 3) is produced.

Figure 6J:
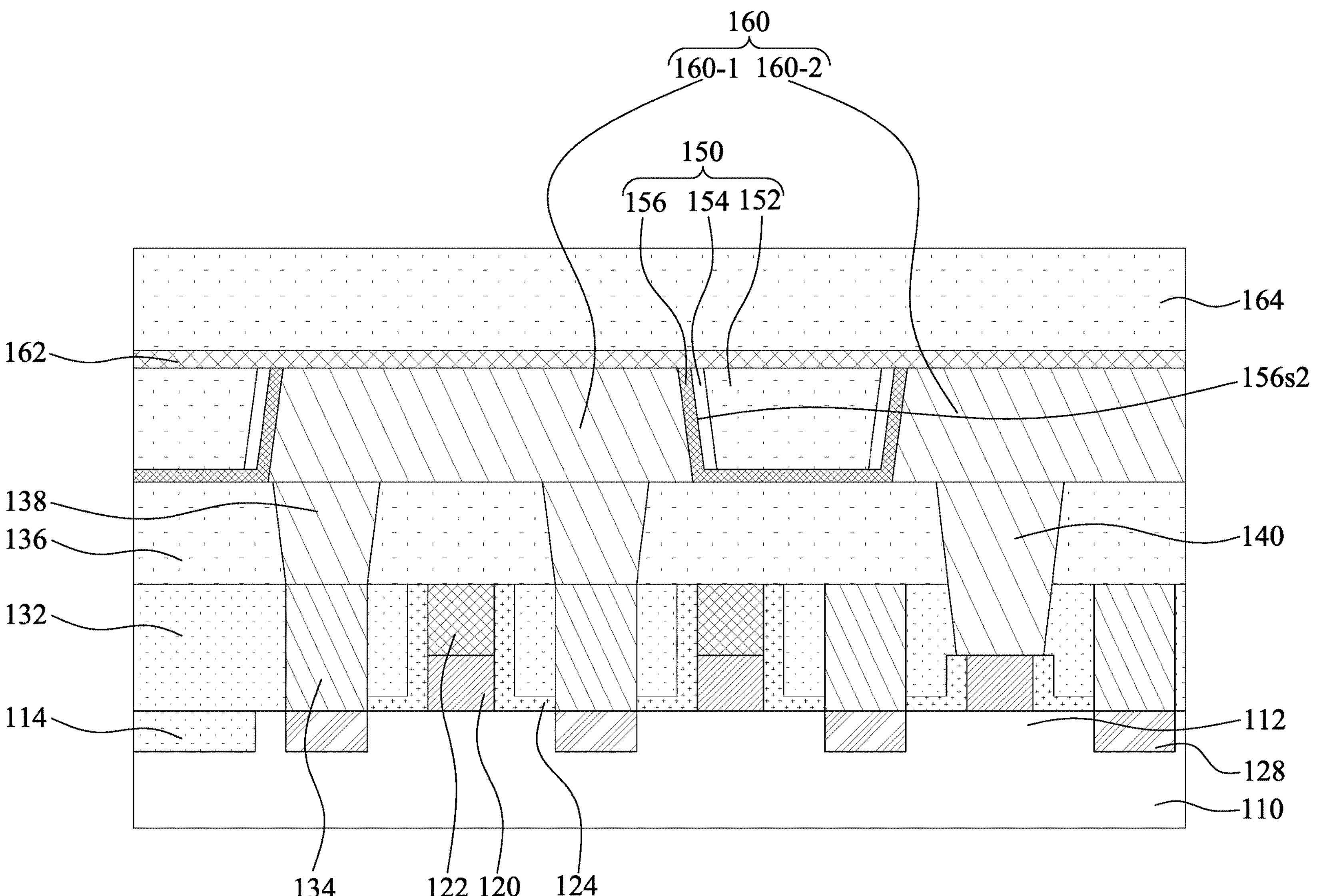

Referring to FIG. 6J, an etching stop layer 162 is formed to cover the dielectric layer 152, the leakage-improving component 154 and the dielectric layer 156. Since the leakage-improving component 154 has a width of less than or equal to about 5 nm, reacting gas of the etching stop layer may not fill in the leakage-improving component 154 (e.g., the air gap). Therefore, the surface **156*s*2 of the dielectric layer 156 can be uncovered by the etching stop layer 162. In another embodiment, an upper portion of the air gap is filled with the etching stop layer 162. As a result, an upper portion of the surface 156*s*2 of the dielectric layer 156 is covered by the etching stop layer 162, and a lower portion of the surface 156*s*2 of the dielectric layer 156 is uncovered by the etching stop layer 162. Then, a dielectric layer 164 is formed on the etching stop layer 162**.

Figure 6K:
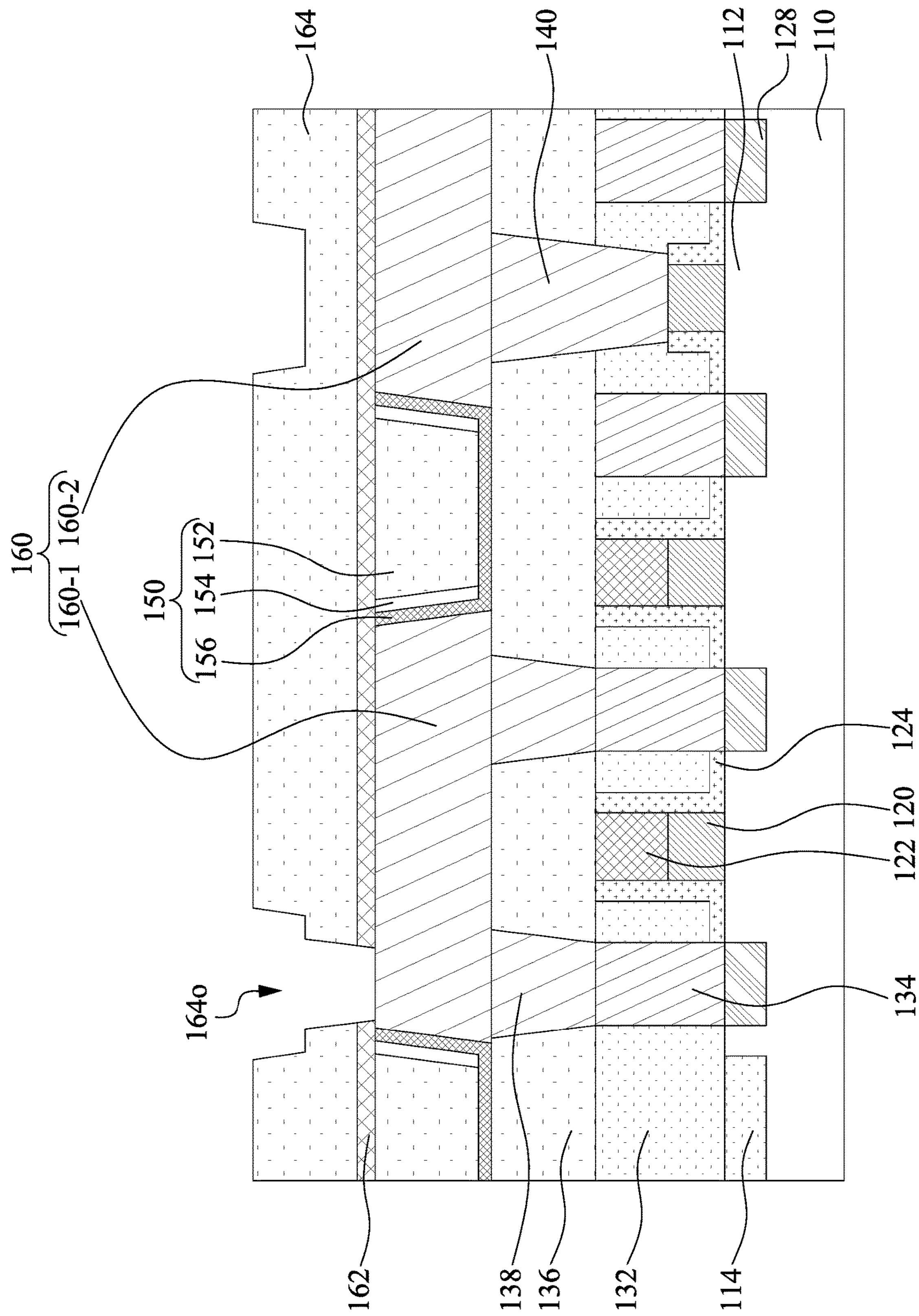

Referring to FIG. 6K, the etching stop layer 162 and the dielectric layer 164 are patterned to form openings **164*o* by, for example, a lithography process. The formation of the dielectric layer 156 may prevent the leakage-improving component 154 from being exposed by the etching stop layer 162** if the overlay of the lithography process shifts.

Figure 6L:
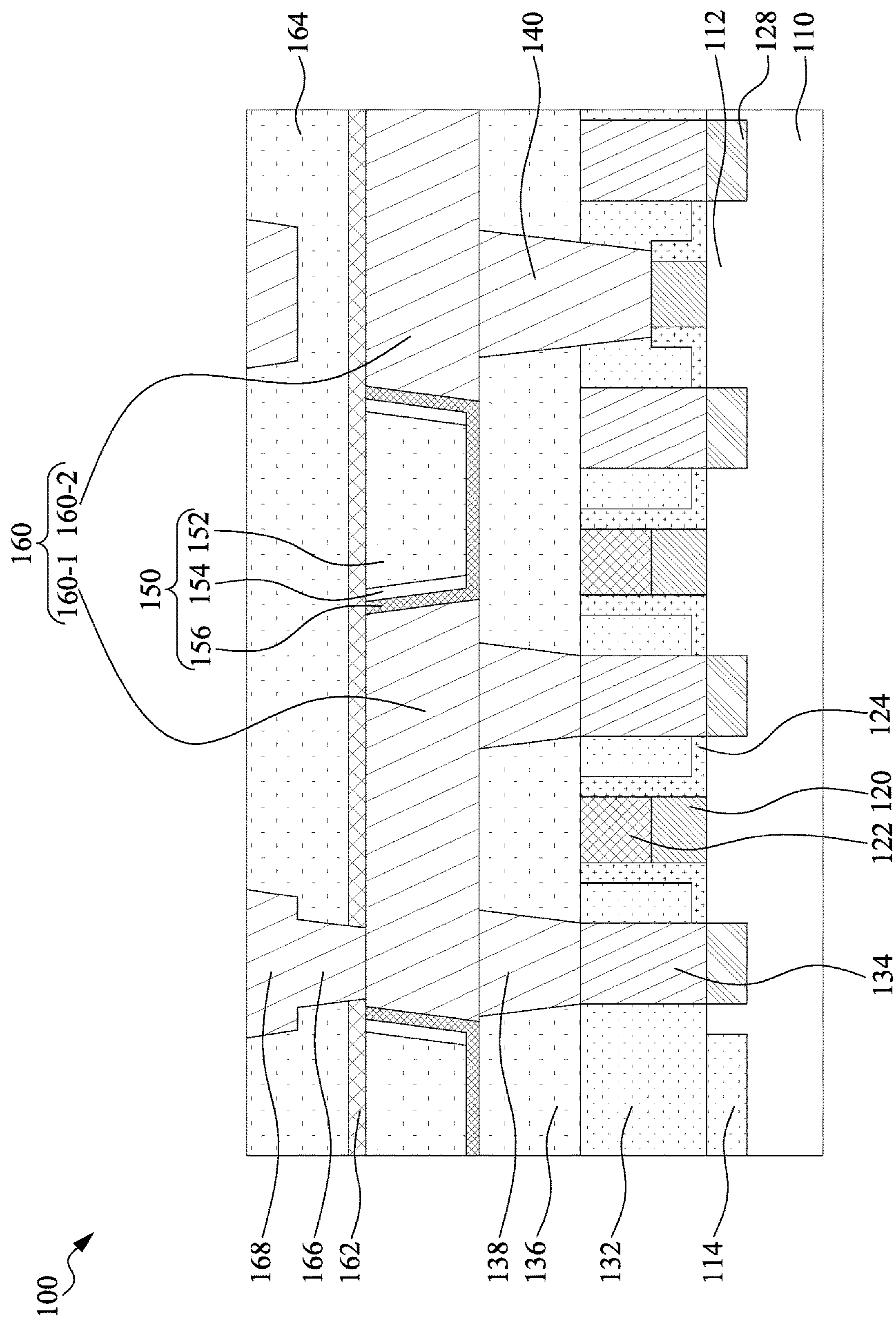

Referring to FIG. 6L, a conductive via 166 and a conductive layer 168 are formed to fill the openings **164*o* such that the semiconductor device 100** is produced.

Some embodiments of the present disclosure provide a semiconductor device. The semiconductor device includes a substrate, a gate structure, a conductive layer and a dielectric structure. The gate structure is disposed on the substrate. The conductive layer is disposed on the gate structure and electrically connected to the gate structure. The dielectric structure surrounds the conductive layer. The dielectric structure includes a leakage-improving component spaced apart from the conductive layer.

Some embodiments of the present disclosure provide a semiconductor device. The semiconductor device includes a substrate including S/D regions, a gate structure, a contact, a conductive layer, and an air gap. The gate structure is disposed on the substrate. The contact is disposed on the S/D regions. The conductive layer includes a first portion electrically connected to the gate structure and a second portion electrically connected to the electrode. The air gap is disposed between the first portion and the second portion of the conductive layer.

Some embodiments of the present disclosure provide a method of manufacturing a semiconductor device. The method includes: providing a substrate; forming a gate structure on the substrate; forming a conductive layer on the gate structure; patterning the conductive layer to form an opening; forming a leakage-improving component in the opening defined by the conductive layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

an interlayer dielectric (ILD) disposed on the substrate;

a conductive layer disposed on the substrate and spaced apart from the ILD by an air gap, wherein the ILD is tapered toward the substrate; and an etching stop layer disposed over the ILD, wherein the etching stop layer has a lower surface covering the ILD and exposed to the air gap.

2. The semiconductor device of claim 1, wherein a dielectric constant of the air gap is less than that of the ILD.

3. The semiconductor device of claim 1, further comprising:

a dielectric layer disposed between the conductive layer and the air gap.

4. The semiconductor device of claim 3, wherein the dielectric layer has a lateral surface defining a recess tapered toward the substrate.

5. The semiconductor device of claim 4, wherein the lateral surface of the dielectric layer is exposed to the air gap.

6. The semiconductor device of claim 3, further comprising:

a conductive via disposed on the conductive layer, and the conductive via is spaced apart from the air gap.

7. The semiconductor device of claim 6, wherein a portion of the dielectric layer is covered by the conductive via.

8. The semiconductor device of claim 6, wherein a portion of the dielectric layer is exposed by the conductive via.

9. The semiconductor device of claim 3, wherein the etching stop layer covers the dielectric layer.

10. A semiconductor device, comprising:

a substrate;

an interlayer dielectric (ILD) disposed on the substrate;

a conductive layer comprises a first portion and a second portion spaced apart from the first portion; and an air gap surrounding the ILD and disposed between the first portion and the second portion of the conductive layer, wherein the air gap is conformally on a lateral surface of the ILD.

11. The semiconductor device of claim 10, further comprising:

a dielectric layer disposed between the conductive layer and the air gap.

12. The semiconductor device of claim 11, wherein the dielectric layer has a lateral surface defining a recess tapered toward the substrate.

13. The semiconductor device of claim 12, wherein the lateral surface of the dielectric layer is exposed to the air gap.

14. The semiconductor device of claim 11, further comprising:

a conductive via disposed on the first portion of the conductive layer, and the conductive via is spaced apart from the air gap.

15. The semiconductor device of claim 14, wherein the first portion of the conductive layer is tapered along a direction far away from the substrate.

16. The semiconductor device of claim 15, wherein the conductive via is tapered toward the substrate.

17. A semiconductor device, comprising:

a substrate;

an interlayer dielectric (ILD) disposed on the substrate;

a dielectric layer spaced apart from the ILD by an air gap, wherein a first lateral surface of the ILD is exposed to the air gap, a second lateral surface of the dielectric layer is exposed to the air gap, and a distance between the first lateral surface and the second lateral surface is substantially uniform; and a conductive layer disposed on the substrate and spaced apart from the ILD by the dielectric layer.

18. The semiconductor device of claim 17, wherein the ILD is tapered toward the substrate.

19. The semiconductor device of claim 17, wherein the dielectric layer has a bottom surface on which the ILD is disposed.

20. The semiconductor device of claim 17, wherein a width of the air gap is substantially uniform in a cross-sectional view.

* * * * *